US012578377B2

(12) United States Patent
Rossi et al.

(10) Patent No.: US 12,578,377 B2
(45) Date of Patent: Mar. 17, 2026

(54) GATE STRESS TEST ARCHITECTURE

(71) Applicant: STMicroelectronics International N.V., Geneva (CH)

(72) Inventors: Sandro Rossi, Pavia (IT); Niccolò Brambilla, San Donato Milanese (IT); Francesco Franco, Milan (IT); Valeria Bottarel, Novara (IT)

(73) Assignee: STMicroelectronics International N.V., Geneva (CH)

( * ) Notice: Subject to any disclaimer, the term of this patent is extended or adjusted under 35 U.S.C. 154(b) by 187 days.

(21) Appl. No.: 18/629,331

(22) Filed: Apr. 8, 2024

(65) Prior Publication Data

US 2025/0314690 A1 Oct. 9, 2025

(51) Int. Cl.
G01R 31/26 (2020.01)
H03K 17/06 (2006.01)

(52) U.S. Cl.
CPC ....... G01R 31/2642 (2013.01); H03K 17/063 (2013.01); H03K 2217/0072 (2013.01)

(58) Field of Classification Search
CPC .......................... H03K 17/063; G01R 31/2621
USPC ..................................................... 324/762.09
See application file for complete search history.

(56) References Cited

U.S. PATENT DOCUMENTS

| | | | |
|---|---|---|---|
| 7,562,318 B2 | 7/2009 | Ang | |
| 8,988,117 B2 | 3/2015 | Li | |
| 9,490,786 B2 | 11/2016 | Zeng | |
| 11,549,998 B1 | 1/2023 | Giunta | |
| 11,573,261 B2 | 2/2023 | Lee | |
| 11,624,769 B2 | 4/2023 | Gonzalez Diaz | |
| 2017/0346475 A1* | 11/2017 | de Rooij | H03K 17/0406 |
| 2018/0059166 A1* | 3/2018 | Bodano | G01R 31/27 |

FOREIGN PATENT DOCUMENTS

CN 109039328 B 8/2022

* cited by examiner

*Primary Examiner* — Roberto Velez
(74) *Attorney, Agent, or Firm* — Slater Matsil, LLP

(57) ABSTRACT
According to an embodiment, a circuit for transistor gate stress testing is proposed. The circuit includes a first p-channel MOSFET with its drain linked to the transistor's gate; a second p-channel MOSFET coupling its source to the first p-channel MOSFET's source at a node and its drain to a supply voltage; a first n-channel MOSFET with its source to ground and drain to the transistor's gate; a second n-channel MOSFET with its source to ground and drain to the second p-channel MOSFET's gate; a third p-channel MOSFET with its source and drain bridging the node to the second n-channel MOSFET's drain; a fourth p-channel MOSFET in trans-diode setup, its gate to the third p-channel MOSFET's gate and source to the supply rail; plus a current source placed between the fourth p-channel MOSFET's drain and ground.

20 Claims, 8 Drawing Sheets

100

800

600

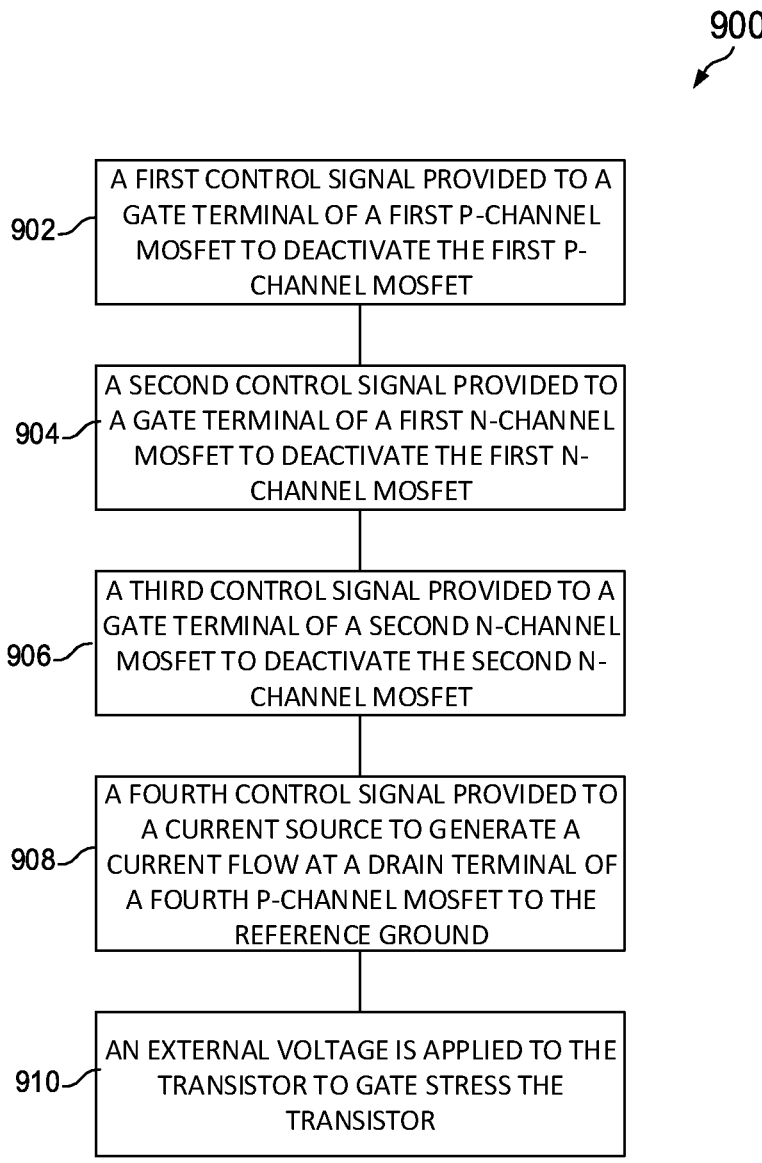

900

| | |
|---|---|
| 902 | A FIRST CONTROL SIGNAL PROVIDED TO A GATE TERMINAL OF A FIRST P-CHANNEL MOSFET TO DEACTIVATE THE FIRST P-CHANNEL MOSFET |
| 904 | A SECOND CONTROL SIGNAL PROVIDED TO A GATE TERMINAL OF A FIRST N-CHANNEL MOSFET TO DEACTIVATE THE FIRST N-CHANNEL MOSFET |
| 906 | A THIRD CONTROL SIGNAL PROVIDED TO A GATE TERMINAL OF A SECOND N-CHANNEL MOSFET TO DEACTIVATE THE SECOND N-CHANNEL MOSFET |
| 908 | A FOURTH CONTROL SIGNAL PROVIDED TO A CURRENT SOURCE TO GENERATE A CURRENT FLOW AT A DRAIN TERMINAL OF A FOURTH P-CHANNEL MOSFET TO THE REFERENCE GROUND |
| 910 | AN EXTERNAL VOLTAGE IS APPLIED TO THE TRANSISTOR TO GATE STRESS THE TRANSISTOR |

FIG. 9

GATE STRESS TEST ARCHITECTURE

TECHNICAL FIELD

The present disclosure generally relates to quality assurance in electronic devices and, in particular embodiments, to gate stress testing.

BACKGROUND

Numerous sectors, including the automotive industry, require meticulous quality assurance practices for electronic components. A gate stress test is a vital part of such quality protocols, evaluating the integrity and dependability of the gate oxide in power devices—an element crucial to their operational effectiveness and life span.

The gate stress test involves applying a consistent voltage to the gate of a power device, intentionally exceeding the device's highest-rated capacity. This procedure challenges the gate oxide layer by subjecting it to elevated voltages for a set duration, pushing it beyond its normal operational limits. The test aims to simulate conditions more severe than those encountered during regular use, ensuring the devices can withstand extreme scenarios.

The value of the gate stress test lies in its capacity to screen out power devices that exhibit potential weakness in the oxide layer. By doing so proactively, only components with robust and durable gate oxides are used in electronic assemblies, enhancing electronic systems' overall quality and trustworthiness for various applications, from consumer gadgets to sophisticated industrial machinery.

SUMMARY

Technical advantages are generally achieved by embodiments of this disclosure, which describe gate stress testing.

A first aspect relates to a circuit for gate stress testing a transistor. The circuit includes a first p-channel metal-oxide-semiconductor field effect transistor (MOSFET), a drain terminal of the first p-channel MOSFET coupled to a gate terminal of the transistor; a second p-channel MOSFET, a source terminal and a drain terminal of the second p-channel MOSFET coupled to a source terminal of the first p-channel MOSFET at a first node and a supply voltage rail, respectively; a first n-channel MOSFET, a source terminal and a drain terminal of the first n-channel MOSFET coupled to a reference ground and the gate terminal of the transistor, respectively; a second n-channel MOSFET, a source terminal and a drain terminal of the second n-channel MOSFET coupled to the reference ground and a gate terminal of the second p-channel MOSFET, respectively; a third p-channel MOSFET, a source terminal and a drain terminal of the third p-channel MOSFET coupled to the first node and the drain terminal of the second n-channel MOSFET, respectively; a fourth p-channel MOSFET arranged in a trans-diode configuration, a gate terminal of the third p-channel MOSFET coupled to a gate terminal of the fourth p-channel MOSFET, a source terminal of the fourth p-channel MOSFET coupled to the supply voltage rail; and a current source arranged between the drain terminal of the fourth p-channel MOSFET and the reference ground.

A second aspect relates to a DC-DC converter that includes a control circuitry, a low-side switch, and a circuit for gate stress testing the low-side switch. The circuit includes a first p-channel metal-oxide-semiconductor field effect transistor (MOSFET), a drain terminal of the first p-channel MOSFET coupled to a gate terminal of the low-side switch; a second p-channel MOSFET, a source terminal and a drain terminal of the second p-channel MOSFET coupled to a source terminal of the first p-channel MOSFET at a first mode node and a supply voltage rail, respectively; a first n-channel MOSFET, a source terminal and a drain terminal of the first n-channel MOSFET coupled to a reference ground and the gate terminal of the low-side switch, respectively; a second n-channel MOSFET, a source terminal and a drain terminal of the second n-channel MOSFET coupled to the reference ground and a gate terminal of the second p-channel MOSFET, respectively; a third p-channel MOSFET, a source terminal and a drain terminal of the third p-channel MOSFET coupled to the first mode node and the drain terminal of the second n-channel MOSFET, respectively; a fourth p-channel MOSFET arranged in a trans-diode configuration, a gate terminal of the third p-channel MOSFET coupled to a gate terminal of the fourth p-channel MOSFET, a source terminal of the fourth p-channel MOSFET coupled to the supply voltage rail; and a current source arranged between the drain terminal of the fourth p-channel MOSFET and the reference ground.

A third aspect relates to a method for gate stress testing a transistor. The method includes applying a first control signal to a gate terminal of a first p-channel metal-oxide-semiconductor field effect transistor (MOSFET) to deactivate the first p-channel MOSFET, a drain terminal of the first p-channel MOSFET coupled to a gate terminal of the transistor; applying a second control signal to a gate terminal of a first n-channel MOSFET to deactivate the first n-channel MOSFET, a source terminal and a drain terminal of the first n-channel MOSFET coupled to a reference ground and the gate terminal of the transistor, respectively; applying a third control signal to a gate terminal of a second n-channel MOSFET to deactivate the second n-channel MOSFET and place the gate terminal of a second p-channel MOSFET as a floating node, a source terminal and a drain terminal of the second n-channel MOSFET coupled to the reference ground and a gate terminal of the second p-channel MOSFET, respectively, and a source terminal and a drain terminal of the second p-channel MOSFET coupled to a source terminal of the first p-channel MOSFET at a first node and a supply voltage rail, respectively; applying a fourth control signal to a current source to generate a current flow at a drain terminal of a fourth p-channel MOSFET to the reference ground, the fourth p-channel MOSFET arranged in a trans-diode configuration, a gate terminal of a third p-channel MOSFET coupled to a gate terminal of the fourth p-channel MOSFET, a source terminal of the fourth p-channel MOSFET coupled to the supply voltage rail, and a source terminal and a drain terminal of the third p-channel MOSFET coupled to the first node and the drain terminal of the second n-channel MOSFET, respectively; and applying an external voltage to the transistor to gate stress the transistor, wherein in response to the external voltage exceeding a voltage at the supply voltage rail, the second p-channel MOSFET transitions from an ON state to an OFF state.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which:

FIG. 9 is a flow chart of a method for operating a low-side drive circuitry used to gate stress a transistor.

DETAILED DESCRIPTION OF ILLUSTRATIVE EMBODIMENTS

Figure 1:
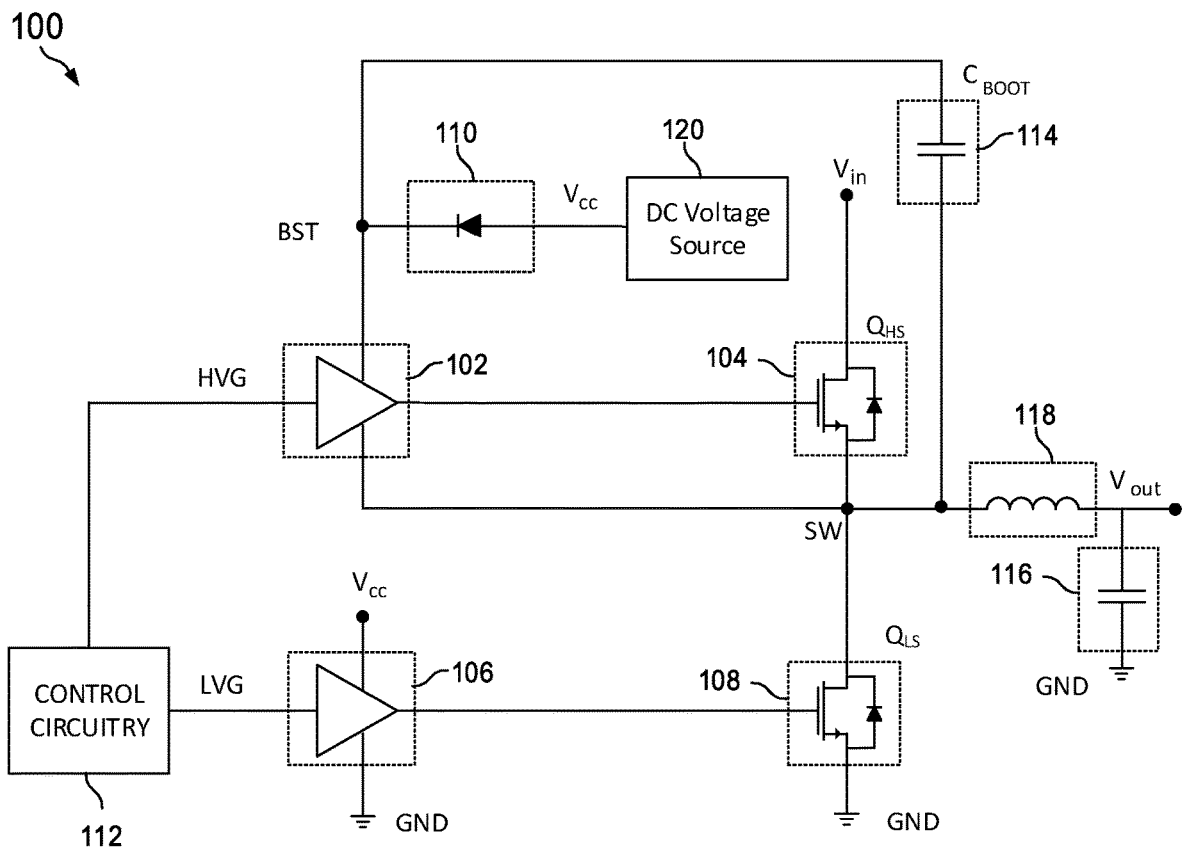
FIG. 1 is a schematic of a DC-DC converter.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of a low-side switch in a buck converter, they may also apply to other transistors that benefit from gate stress testing, such as linear voltage regulators, light emitting diode (LED) drivers, battery management circuits, and motor drivers. In particular, aspects of this disclosure may similarly apply to active components of an automotive-grade device that overcomes a certain area threshold that requires gate stress testing, such as linear regular switches, power management integrated circuits, or gate drivers in other high-power devices, such as power metal-oxide-semiconductor field effect transistors (MOSFETs) in a half-bridge circuit or a driver circuit.

Aspects of this disclosure propose a gate stress testing circuit, system, and method that eliminates the need for a resistor found in conventional solutions, which typically needs to be carefully sized to minimize static power dissipation. In embodiments, by removing the resistor, a reduction in area is achieved through a source current and two added switches. In embodiments, the proposed solution, in contrast to the conventional solutions, does not require additional high-voltage components. These and other details are further detailed below.

The driving stage—an integral part of an electronic system-must be robust enough to tolerate the increased voltages used during gate stress testing without damaging or degrading the circuit's functional operation. During this test, all components associated with the driving stage remain within an acceptable voltage operating range in accordance with their voltage class, except for power elements that are intentionally stress-tested.

To ensure the safety and integrity of the test, conductive paths from the stressed gate to the system's power rails should be eliminated. Furthermore, any solutions created to make the driving stage compatible with gate-stress testing should not introduce unnecessary static power consumption or impair the system's dynamic performance when operating normally.

Moreover, when adding components to enhance compatibility with gate-stress testing, one must consider how they affect the total size of the driving stage. These components should be integrated to keep additional area consumption to a minimum. Such careful integration guarantees the system's performance remains efficient without compromising space efficiency.

FIG. 1 illustrates a schematic of a DC-DC converter 100 as an example circuit that can benefit from gate stress testing. The DC-DC converter 100 includes high-side drive circuitry 102, a high-side transistor ($Q_{HS}$) 104, low-side drive circuitry 106, a low-side transistor ($Q_{LS}$) 108, a bootstrap diode 110, a bootstrap capacitor ($C_{BOOT}$) 114, an output capacitor 116, an inductor 118, and a DC voltage source 120, which may (or may not) be arranged as shown.

In the DC-DC converter 100, the control circuitry 112 alternately drives the high-side transistor ($Q_{HS}$) 104 and the low-side transistor ($Q_{LS}$) 108 ON and OFF, respectively, via the high-side signal (HVG) and the low-side signal (LVG) to create a desired output voltage ($V_{OUT}$). The DC Voltage Source 120 is configured to generate a regulated voltage ($V_{CC}$) provided to the bootstrap diode 110 and the low-side drive circuitry 106. In embodiments, the regulated voltage ($V_{CC}$) is generated by the DC Voltage Source 120 using, for example, an internal linear regulator, a low-drop-out regulator, a battery supply, an auxiliary DC-DC converter, or the like (not shown).

In embodiments, the regulated voltage ($V_{cc}$) is generated by the DC Voltage Source 120 using an auxiliary winding (not shown) coupled to the transformer, a rectification diode (not shown), and a buffer capacitor (not shown) to obtain a substantially DC voltage. The output capacitor 116 and inductor 118 form an LC circuit at the output of the DC-DC converter 100 to produce the desired DC output voltage.

The bootstrap diode 110 and the bootstrap capacitor ($C_{BOOT}$) 114 form a bootstrap circuit to generate a boosted voltage (i.e., greater or equal to the minimum gate-source voltage ($V_{gs}$) of the high-side transistor ($Q_{HS}$) 104) to efficiently drive the high-side transistor ($Q_{HS}$) 104 by the high-side drive circuitry 102.

Generally, the low-side transistor ($Q_{LS}$) 108 is directly controlled using control circuitry 112 coupled to the input of the low-side drive circuitry 106. However, directly controlling the high-side transistor ($Q_{HS}$) 104 by control circuitry 112 becomes more challenging because the source terminal of the high-side transistor ($Q_{HS}$) 104, when the high-side transistor 104 is implemented, for example, as an n-channel MOSFET in a buck converter, is not connected to a ground reference.

During the ON state of the low-side transistor ($Q_{LS}$) 108 (i.e., OFF phase of the converter), the switching node (SW) is connected to reference ground. The bootstrap capacitor ($C_{BOOT}$) 114 is charged to a voltage equal to the difference between the regulated voltage ($V_{cc}$) and the threshold voltage of the bootstrap diode 110 as current flows through the bootstrap diode 110 from the regulated voltage ($V_{cc}$). The bootstrap diode 110 is forward-biased and will charge the bootstrap capacitor ($C_{BOOT}$) 114 to a voltage slightly below the regulated voltage ($V_{cc}$). In embodiments, the bootstrap diode 110 is replaced by a switch.

During the ON state of the high-side transistor ($Q_{HS}$) 104 (i.e., the ON phase of the converter), the switching node transitions from the ground reference potential to the input voltage (VIN). Correspondingly, the charged bootstrap capacitor ($C_{BOOT}$) 114 behaves as a floating supply rail following the potential at node SW, resulting in the bootstrap node (BST) being maintained at roughly the sum of the potential at node SW and the regulated voltage ($V_{CC}$). The gate-to-source voltage ($V_{GS}$) of the high-side transistor ($Q_{HS}$) 104 goes from a zero voltage to a maximum bootstrap rail voltage ($V_{CC}$). At this point, it turns entirely ON (i.e., becomes entirely conductive).

Figure 2:
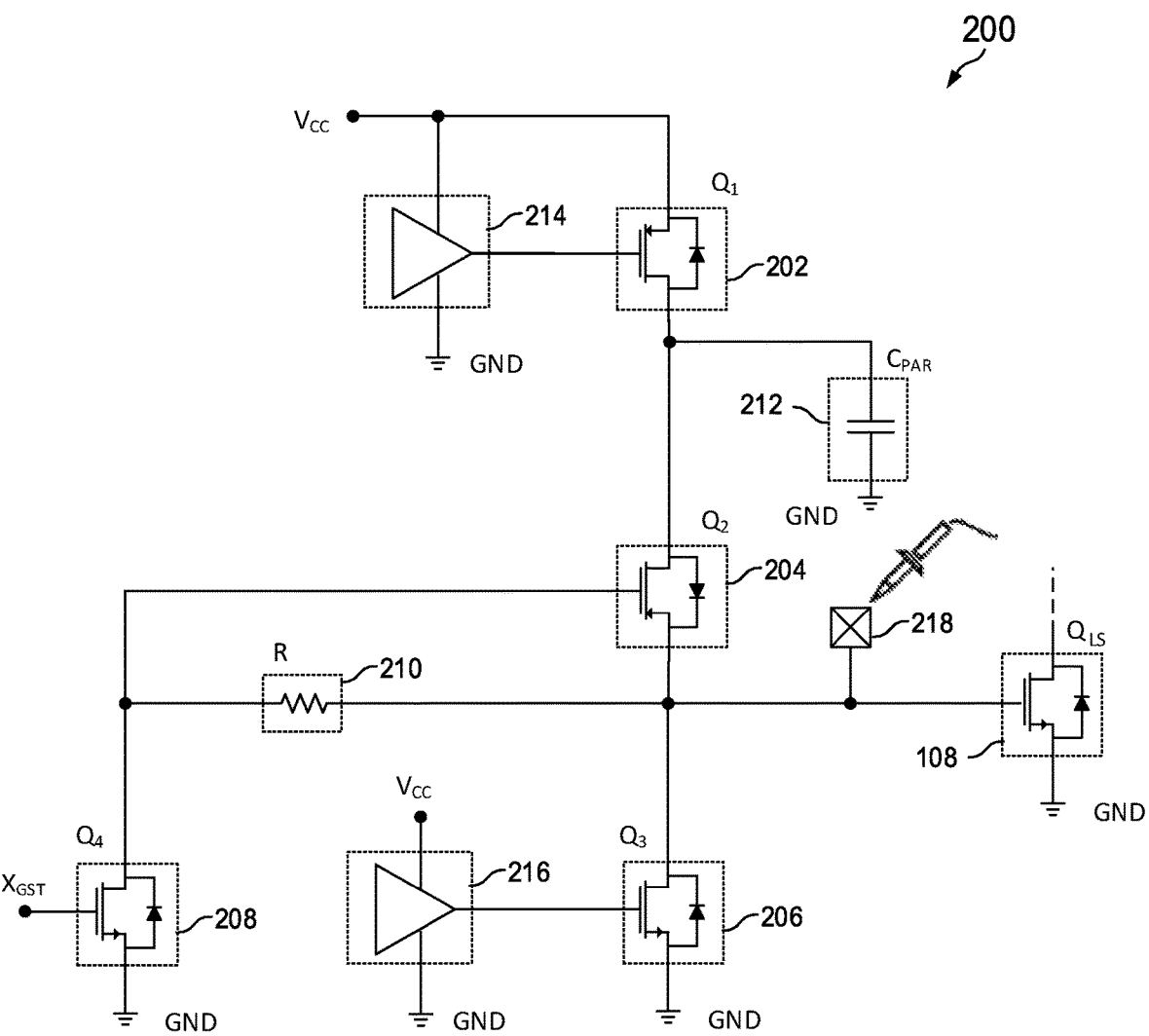
FIG. 2 is a schematic of a low-side drive circuitry.

FIG. 2 illustrates a schematic of a low-side drive circuitry 200, which may be implemented, for example, as the low-side drive circuitry 106 in the DC-DC converter 100 and to gate stress the low-side transistor ($Q_{LS}$) 108. Low-side drive circuitry 200 includes a first transistor ($Q_1$) 202, a second transistor ($Q_2$) 204, a third transistor ($Q_3$) 206, a fourth transistor ($Q_4$) 208, a resistor (R) 210, a parasitic capacitor ($C_{PAR}$) 212, a first driving stage circuit 214, and a second driving stage circuit 216, which may (or may not) be arranged as shown.

In embodiments, the first transistor ($Q_1$) 202 and the second transistor ($Q_2$) 204 are implemented as p-channel MOSFETs. In contrast, the third transistor ($Q_3$) 206 and the fourth transistor ($Q_4$) 208 are implemented as n-channel MOSFETs.

In embodiments, the first transistor ($Q_1$) 202, the second transistor ($Q_2$) 204, the third transistor ($Q_3$) 206, and the fourth transistor ($Q_4$) 208 are implemented as enhancement-mode MOSFETs.

The source terminal of the first transistor ($Q_1$) 202 is coupled to the regulated voltage ($V_{CC}$). The drain terminal of the first transistor ($Q_1$) 202 is coupled to a drain terminal of the second transistor ($Q_2$) 204 and the first terminal of the parasitic capacitor ($C_{PAR}$) 212—the second terminal of the parasitic capacitor ($C_{PAR}$) 212 is coupled to reference ground (GND). The gate terminal of the first transistor ($Q_1$) 202 is coupled to an output of the first driving stage circuit 214.

The source terminal of the second transistor ($Q_2$) 204 is coupled to a first terminal of the resistor (R) 210, the drain terminal of the third transistor ($Q_3$) 206, and the gate terminal of the low-side transistor ($Q_{LS}$) 108. The drain terminal of the second transistor ($Q_2$) 204 is coupled to the drain terminal of the first transistor ($Q_1$) 202 and the first terminal of the parasitic capacitor ($C_{PAR}$) 212. And the gate terminal of the second transistor ($Q_2$) 204 is coupled to a second terminal of the resistor (R) 210 and the drain terminal of the fourth transistor ($Q_4$) 208.

The source terminal of the third transistor ($Q_3$) 206 is coupled to the reference ground (GND). The drain terminal of the third transistor ($Q_3$) 206 is coupled to the first terminal of the resistor (R) 210, the gate terminal of the low-side transistor ($Q_{LS}$) 108, and the source terminal of the second transistor ($Q_2$) 204. The gate terminal of the third transistor ($Q_3$) 206 is coupled to an output of the second driving stage circuit 216.

The source terminal of the fourth transistor ($Q_4$) 208 is coupled to the reference ground (GND). The drain terminal of the fourth transistor ($Q_4$) 208 is coupled to the second terminal of the resistor (R) 210 and the gate terminal of the second transistor ($Q_2$) 204. The gate terminal of the fourth transistor ($Q_4$) 208 is coupled to a control circuit, such as the control circuitry 112. In embodiments, the control circuitry 112 generates a control signal ($X_{GST}$), an inverted gate stress test (GST) signal.

To perform gate stress testing on the low-side transistor ($Q_{LS}$) 108, a contact probe (e.g., needles) of an automated test equipment (ATE) probe card contacts pad 218 to apply an external high voltage to the gate terminal of the low-side transistor ($Q_{LS}$) 108.

The first transistor ($Q_1$) 202 and the third transistor ($Q_3$) 206 constitute the low-side drive circuitry, combining pull-up and pull-down circuitry. The second transistor ($Q_2$) 204, the fourth transistor ($Q_4$) 208, and the resistor (R) 210 are used for gate stress testing.

In functional mode, referring to the standard operation where power elements are actuated, the first transistor ($Q_1$) 202 and the third transistor ($Q_3$) 206 drives the gate of the low-side transistor ($Q_{LS}$) 108 toward the regulated voltage ($V_{CC}$) or reference ground, respectively. The second transistor ($Q_2$) 204 remains constantly conductive; hence, its gate is invariably held to the reference ground by activating the fourth transistor ($Q_4$) 208.

During gate stress, modifications are made to this setup to accommodate higher voltage levels that are externally applied to the gate of the low-side transistor ($Q_{LS}$) 108. The fourth transistor ($Q_4$) 208 is left open in this scenario. Accordingly, the second transistor ($Q_2$) 204 is deactivated (i.e., OFF) through the voltage applied at pad 218. Concurrently, the first transistor ($Q_1$) 202 is kept active to limit the voltage variation across the second transistor ($Q_2$) 204. As the second transistor ($Q_2$) 204 is deactivated and no conductive path is available from pad 218 to the first transistor ($Q_1$) 202, the voltage applied to pad 218 is isolated from the DC voltage source 120 (i.e., no current is injected into the power supply).

During functional mode, resistor (R) 210 is tasked with keeping the gate of the second transistor ($Q_2$) 204 grounded via the fourth transistor ($Q_4$) 208. This configuration, however, introduces a drawback in the form of a static power loss ($P_{STAT}$). The static power loss ($P_{STAT}$) can be quantified using the following equation:

$$P_{stat} = \frac{V_{CC}^2}{R} \times (1 - \text{duty}),$$

where R is the resistance value of resistor (R) 210, $V_{CC}$ is the voltage level of the regulated supply voltage ($V_{CC}$), and 'duty' refers to the duty cycle that is relevant to the operation of, for example, the DC-DC converter 100.

An additional drawback of the low-side drive circuitry 200 is an amplified dynamic power loss ($P_{DYN}$) during functional mode. This is caused by the repeated charging and discharging cycles of the parasitic capacitor ($C_{PAR}$) 212. Typically, parasitic capacitance is a byproduct of the driving circuitry design, and its presence is often inevitable, even in scenarios where the circuit is not explicitly designed for gate stress testing purposes. In the case of the low-side drive circuitry 200, the second transistor ($Q_2$) 204 contributes to an enlargement of the parasitic capacitor ($C_{PAR}$) 212. The formula to calculate dynamic power loss ($P_{DYN}$) is given by $$P_{DYN} = \frac{1}{2} * C_{PAR} \times V_{CC}^2 \times f_{sw},$$

where $C_{PAR}$ represents the capacitive value of the parasitic capacitor ($C_{PAR}$) 212 and $f_{sw}$ denotes the switching frequency of, for example, the DC-DC converter 100. Consequently, as the low-side drive circuitry 200 necessitates a larger parasitic capacitor ($C_{PAR}$) 212 to accommodate the second transistor ($Q_2$) 204, there is a significant uptick in dynamic power loss ($P_{DYN}$).

Moreover, the increased parasitic capacitance causes decreased switching speed of connected elements, such as the low-side transistor ($Q_{LS}$) 108 of the DC-DC converter 100, further exacerbating the circuit's performance limitations.

Figure 3:
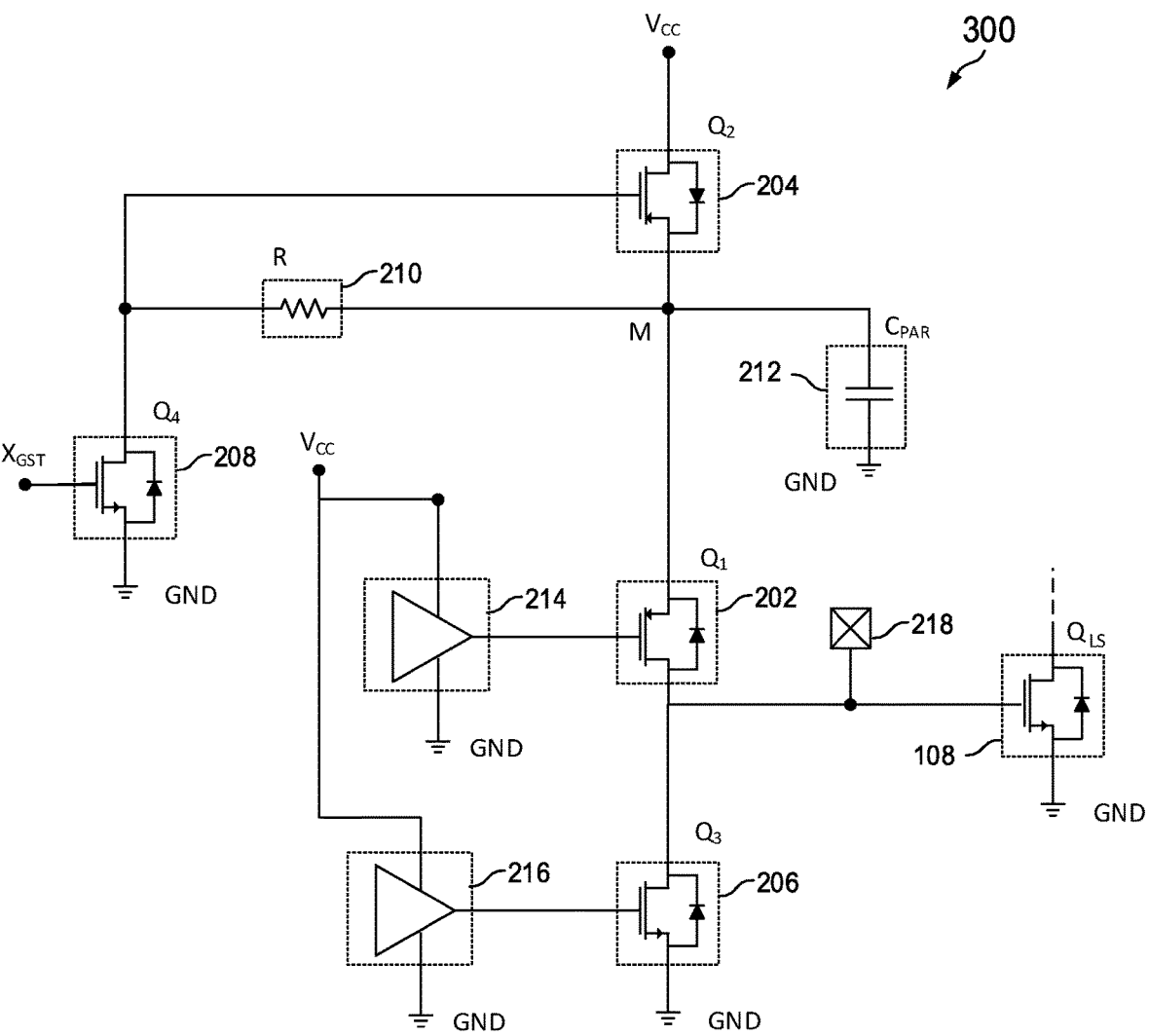
FIG. 3 is a schematic of an embodiment low-side drive circuitry.

FIG. 3 illustrates a schematic of an embodiment low-side drive circuitry 300, which may be implemented, for example, as the low-side drive circuitry 106 in the DC-DC converter 100 and to gate stress the low-side transistor ($Q_{LS}$) 108. Similar to the low-side drive circuitry 200, the low-side drive circuitry 300 includes the first transistor ($Q_1$) 202, the second transistor ($Q_2$) 204, the third transistor ($Q_3$) 206, the fourth transistor ($Q_4$) 208, the resistor (R) 210, the parasitic capacitor ($C_{PAR}$) 212, the first driving stage circuit 214, and the second driving stage circuit 216, which may (or may not) be arranged as shown. Low-side drive circuitry 300 may include additional components not shown.

As before, the first transistor ($Q_1$) 202 and the second transistor ($Q_2$) 204 are implemented as p-channel MOS-FETs. The third transistor ($Q_3$) 206 and the fourth transistor ($Q_4$) 208 are implemented as n-channel MOSFETs.

In embodiments, the first transistor ($Q_1$) 202 and the third transistor ($Q_3$) 206 are implemented as enhancement-mode p-channel and n-channel, respectively, MOSFETs.

The source terminal of the first transistor ($Q_1$) 202 is coupled to the first terminal of the resistor (R) 210, the first terminal of the parasitic capacitor ($C_{PAR}$) 212, and the source terminal of the second transistor ($Q_2$) 204 at node M. The second terminal of the parasitic capacitor ($C_{PAR}$) 212 is coupled to the reference ground (GND). The drain terminal of the first transistor ($Q_1$) 202 is coupled to a drain terminal of the third transistor ($Q_3$) 206 and the gate terminal of the low-side transistor ($Q_{LS}$) 108. The gate terminal of the first transistor ($Q_1$) 202 is coupled to an output of the first driving stage circuit 214.

The source terminal of the second transistor ($Q_2$) 204 is coupled to the first terminal of the resistor (R) 210, the first terminal of the parasitic capacitor ($C_{PAR}$) 212, and the source terminal of the first transistor ($Q_1$) 202 at node M. The drain terminal of the second transistor ($Q_2$) 204 is coupled to the regulated voltage ($V_{CC}$). The gate terminal of the second transistor ($Q_2$) 204 is coupled to a second terminal of the resistor (R) 210 and the drain terminal of the fourth transistor ($Q_4$) 208.

The source terminal of the third transistor ($Q_3$) 206 is coupled to the reference ground (GND). The drain terminal of the third transistor ($Q_3$) 206 is coupled to a drain terminal of the first transistor ($Q_1$) 202 and the gate terminal of the low-side transistor ($Q_{LS}$) 108. The gate terminal of the third transistor ($Q_3$) 206 is coupled to an output of the second driving stage circuit 216.

The source terminal of the fourth transistor ($Q_4$) 208 is coupled to the reference ground (GND). The drain terminal of the fourth transistor ($Q_4$) 208 is coupled to the second terminal of the resistor (R) 210 and the gate terminal of the second transistor ($Q_2$) 204. The gate terminal of the fourth transistor ($Q_4$) 208 is coupled to a control circuit, such as the control circuitry 112.

In functional mode, the first transistor ($Q_1$) 202 and the third transistor ($Q_3$) 206 drive the gate of the low-side transistor ($Q_{LS}$) 108 toward the regulated voltage ($V_{CC}$) or reference ground, respectively, in accordance with a pulse width modulated (PWM) signal. The second transistor ($Q_2$)

204 remains constantly conductive; hence, its gate is invariably held to the reference ground by activating the fourth transistor ($Q_4$) 208.

During gate stress, the first transistor ($Q_1$) 202, the third transistor ($Q_3$) 206, and the fourth transistor ($Q_4$) 208 are deactivated. The gate of the second transistor ($Q_2$) 204 enters a state of high impedance until the voltage at pad 218 (i.e., gate voltage to the low-side transistor ($Q_{LS}$) 108) surpasses the voltage at node M by at least a threshold voltage corresponding to the body drain diode of the first transistor ($Q_1$) 202.

Advantageously, the configuration of the elements within the low-side drive circuitry 300 varies from that of the low-side drive circuitry 200 to address the limitations found in the low-side drive circuitry 200.

Specifically, in the low-side drive circuitry 300, switches associated with the functional mode (i.e., the first transistor ($Q_1$) 202 and the third transistor ($Q_3$) 206) are directly linked to the power gate. Advantageously, the drain terminal of the second transistor ($Q_2$) 204 is coupled to the regulated voltage ($V_{CC}$), such that the intrinsic body drain diode of the second transistor ($Q_2$) 204 can isolate the conductive path from the external source on the pad 218 from the DC voltage source 120.

This configuration has the added advantage of maintaining the parasitic capacitor ($C_{PAR}$) 212 at node M to the first transistor ($Q_1$) 202 and the second transistor ($Q_2$) 204 in a constantly charged state. The constant charged state at node M minimizes the dynamic power loss ($P_{DYN}$) in the low-side drive circuitry 300 compared to that in the low-side drive circuitry 200. Further, the constant charged state at node M node ensures a rapid switching response for the low-side transistor ($Q_{LS}$) 108 compared to the circuit configuration of the low-side drive circuitry 200. Moreover, the parasitic capacitor ($C_{PAR}$) 212 advantageously filters the regulated voltage ($V_{CC}$).

A trade-off arises with the low-side drive circuitry 300 regarding power consumption to the low-side drive circuitry 200. The static power loss in the low-side drive circuitry 300, due to the resistor (R) 210, $P_{STAT,R}$ equals $$\frac{V_{CC}^2}{R}.$$

Accordingly, the static power loss for the low-side drive circuitry 300 is increased by a factor of $$\frac{1}{(1-\text{duty})}$$

compared to the power loss for the low-side drive circuitry 200.

Further, the third transistor ($Q_3$) 206 and the fourth transistor ($Q_4$) 208 are selected to withstand voltages as high as those experienced during the gate stress test. The voltage ratings for other components within the low-side drive circuitry 300 are chosen based on the highest voltage differential likely to occur between the gate terminal of the low-side transistor ($Q_{LS}$) 108 and the regulated voltage ($V_{CC}$).

Figure 4:
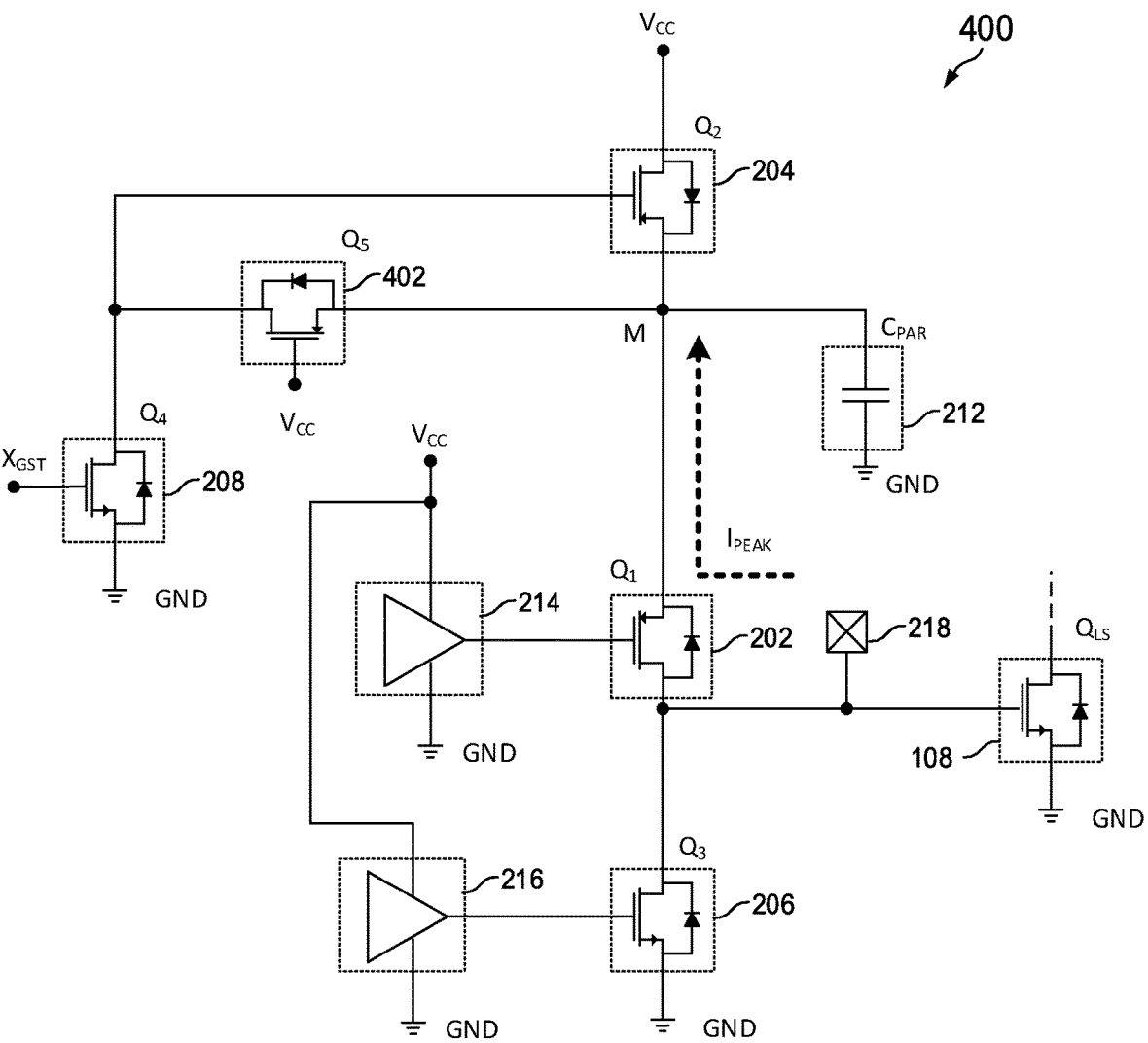
FIG. 4 is a schematic of an embodiment low-side drive circuitry.

FIG. 4 illustrates a schematic of an embodiment low-side drive circuitry 400, which may be implemented, for example, as the low-side drive circuitry 106 in the DC-DC converter 100 and to gate stress the low-side transistor ($Q_{LS}$) 108.

Similar to the low-side drive circuitry 300, the low-side drive circuitry 400 includes the first transistor ($Q_1$) 202, the second transistor ($Q_2$) 204, the third transistor ($Q_3$) 206, the fourth transistor ($Q_4$) 208, the parasitic capacitor ($C_{PAR}$) 212, the first driving stage circuit 214, and the second driving stage circuit 216, which may (or may not) be arranged as shown.

As the majority of the components and their arrangements in the low-side drive circuitry 400 are identical to the low-side drive circuitry 300, the arrangement of the components is not repeated. A distinction with the low-side drive circuitry 300 is the replacement of the resistor (R) 210 with a fifth transistor ($Q_5$) 402 in the low-side drive circuitry 400. Low-side drive circuitry 400 may include additional components not shown.

In embodiments, the fifth transistor ($Q_5$) 402 is implemented as a p-channel MOSFET.

In embodiments, the fifth transistor ($Q_5$) 402 is implemented as an enhancement-mode MOSFET.

The source terminal of the fifth transistor ($Q_5$) 402 is coupled to the source terminal of the first transistor ($Q_1$) 202, the first terminal of the parasitic capacitor ($C_{PAR}$) 212, and the source terminal of the second transistor ($Q_2$) 204 through node M. The drain terminal of the fifth transistor ($Q_5$) 402 is coupled to the drain terminal of the fourth transistor ($Q_4$) 208 and the gate terminal of the second transistor ($Q_2$) 204. During functional mode, the gate terminal of the fifth transistor ($Q_5$) 402 is driven at the regulated voltage ($V_{CC}$).

Advantageously, the static power loss is eliminated by replacing the resistor (R) 210 in the low-side drive circuitry 300 with the fifth transistor ($Q_5$) 402 in the low-side drive circuitry 400.

Further, the resistance of the resistor (R) 210 is typically set in the megaohm (MΩ) range to guarantee that the static current is below 1 microampere (1 μA). Advantageously, the fifth transistor ($Q_5$) 402 can be implemented within a much smaller dimensional space, reducing the total circuit footprint associated with the driving circuit.

In functional mode, the first transistor ($Q_1$) 202 and the third transistor ($Q_3$) 206 drive the gate of the low-side transistor ($Q_{LS}$) 108 toward the regulated voltage ($V_{CC}$) or reference ground, respectively. The second transistor ($Q_2$) 204 remains constantly conductive; hence, its gate is invariably held to the reference ground by activating the fourth transistor ($Q_4$) 208. As the gate terminal of the fifth transistor ($Q_5$) 402 is driven at the regulated voltage ($V_{CC}$), the fifth transistor ($Q_5$) 402 is deactivated.

During gate stress, the voltage at node M ($V_M$) equals the gate stress voltage minus the voltage drop across the parasitic diode of the first transistor ($Q_1$) 202. The fourth transistor ($Q_4$) 208 is deactivated through the control signal ($X_{GST}$) from, for example, the control circuitry 112.

The gate terminal of the fifth transistor ($Q_5$) 402 is coupled to the regulated supply voltage ($V_{CC}$). The fifth transistor ($Q_5$) 402 is activated when the voltage at node M ($V_M$) to be higher than the regulated supply voltage ($V_{CC}$) plus the absolute value of the threshold voltage ($V_{TH,Q5}$)— the threshold voltage ($V_{TH,Q5}$) is typically a negative value, which is represented by the equation: $V_M \geq V_{CC} + |V_{TH,Q5}|$— through the external voltage applied at the pad 218 during gate stress. In response to the fifth transistor ($Q_5$) 402 being activated, the second transistor ($Q_2$) 204 is deactivated (i.e., switched OFF). As the second transistor ($Q_2$) 204 is deactivated, no conductive path exists from the external source on pad 218 to the DC voltage source 120.

A drawback of the proposed configuration in the low-side drive circuitry 400 is that a conductive path can exist between the low-side transistor ($Q_{LS}$) 108 and the regulated supply voltage ($V_{CC}$) through the second transistor ($Q_2$) 204 when the voltage at the low-side transistor ($Q_{LS}$) 108 is in the range from the voltage level of the regulated supply voltage ($V_{CC}$) and the voltage level of the regulated supply voltage ($V_{CC}$) plus the threshold voltage ($V_{TH,Q5}$).

Under normal circumstances, this conductive path doesn't interfere with gate stress operation. Nonetheless, a situation may arise where the peak current ($I_{PEAK}$) from pad 218 to the regulated supply voltage ($V_{CC}$) through the first transistor ($Q_1$) 202 and the second transistor ($Q_2$) 204 exceeds the maximum current that the DC voltage source 120 can deliver. If not properly managed, this could lead to operational concerns.

Figure 5:
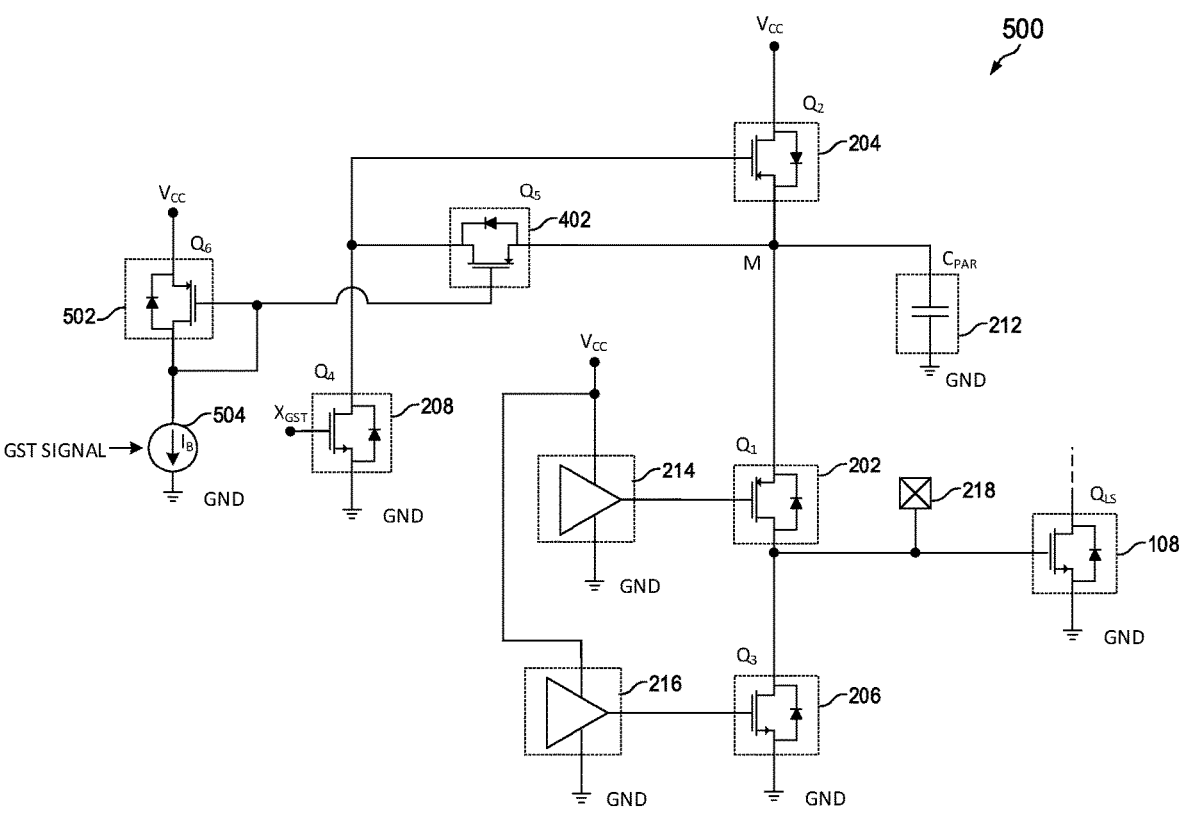
FIG. 5 is a schematic of an embodiment low-side drive circuitry.

FIG. 5 illustrates a schematic of an embodiment low-side drive circuitry 500, which may be implemented, for example, as the low-side drive circuitry 106 in the DC-DC converter 100 and to gate stress the low-side transistor ($Q_{LS}$) 108.

Similar to the low-side drive circuitry 400, the low-side drive circuitry 500 includes the first transistor ($Q_1$) 202, the second transistor ($Q_2$) 204, the third transistor ($Q_3$) 206, the fourth transistor ($Q_4$) 208, the fifth transistor ($Q_5$) 402, the parasitic capacitor ($C_{PAR}$) 212, the first driving stage circuit 214, and the second driving stage circuit 216, which may (or may not) be arranged as shown.

The majority of the components and their arrangements in the low-side drive circuitry 500 are identical to those in the low-side drive circuitry 400, so the arrangement of the components is not repeated. A distinction with the low-side drive circuitry 400 is the addition of a sixth transistor ($Q_6$) 502 in the low-side drive circuitry 500. Low-side drive circuitry 500 may include additional components not shown.

In contrast to the low-side drive circuitry 400, where the gate terminal of the fifth transistor $Q_5$ 402 is driven at the regulated voltage ($V_{CC}$), the gate terminal of the fifth transistor ($Q_5$) 402 in the low-side drive circuitry 500 is coupled to the gate terminal of the sixth transistor ($Q_6$) 502, the drain terminal of the sixth transistor ($Q_6$) 502, and a current sink 504. In embodiments, the operation of the current sink 504 is controlled by a gate stress test (GST) signal that is applied from, for example, the control circuitry 112.

In embodiments, the current sink 504 is implemented as a p-channel MOSFET in series with a resistor. In this configuration, the gate terminal of the transistor is coupled to the gate stress test (GST) signal, which when asserted, turns the transistor ON and allows for a current ($I_B$) to flow. In contrast, when the gate stress test (GST) signal is not asserted, the transistor is OFF, and no current ($I_B$) flows. It should be noted that this architecture can be implemented in various forms by a person of ordinary skill in the art.

In embodiments, the sixth transistor ($Q_6$) 502 is implemented as a p-channel MOSFET in a trans-diode configuration (arrangement).

In embodiments, the sixth transistor ($Q_6$) 502 is implemented as an enhancement-mode MOSFET.

The source terminal of the sixth transistor ($Q_6$) 502 is coupled to the regulated voltage ($V_{CC}$). The gate terminal of the sixth transistor ($Q_6$) 502 is coupled to its drain terminal, which is coupled to the current sink 504.

In functional mode, the first transistor ($Q_1$) 202 and the third transistor ($Q_3$) 206 operate in accordance with the pulse width modulated (PWM) signal to control the operation of the low-side transistor ($Q_{LS}$) 108 in the DC-DC converter 100. The second transistor ($Q_2$) 204 and the fourth transistor ($Q_4$) 208 are activated (i.e., in the ON state). The fifth transistor ($Q_5$) 402 and the sixth transistor ($Q_6$) 502 are deactivated (i.e., in the OFF state) as the current sink 504 is in the OFF state (i.e., no current ($I_B$) flowing through the current source), which eliminates the static power loss during the functional mode.

During gate stress, the first transistor ($Q_1$) 202, the third transistor ($Q_3$) 206, and the fourth transistor ($Q_4$) 208 are deactivated (i.e., in the OFF state). The fourth transistor ($Q_4$) 208 is deactivated through the control signal ($X_{GST}$) from, for example, the control circuitry 112. When the gate stress test (GST) signal is asserted, the control signal ($X_{GST}$) is de-asserted, and vice-versa.

The gate terminal of the fifth transistor ($Q_5$) 402 is biased with a voltage equal to the regulated voltage ($V_{CC}$) minus the source-to-gate voltage ($V_{SG,6}$) of the sixth transistor ($Q_6$) 502. In the trans-diode configuration, the source-to-gate voltage ($V_{SG,6}$) of the sixth transistor ($Q_6$) 502 equals its drain-to-source voltage ($V_{DS,6}$). The source-to-gate ($V_{SG,6}$) of the sixth transistor ($Q_6$) 502 is generated by a current ($I_B$) sink through the current sink 504 by setting the gate stress test (GST) signal.

As the fifth transistor ($Q_5$) 402 is activated (i.e., ON), it provides a conductive path (i.e., short) from the gate terminal of the second transistor ($Q_2$) 204 to node M. The body drain diode of the first transistor ($Q_1$) 202 is forward biased, and the voltage at node M ($V_M$) follows the voltage at the pad 218 (i.e., voltage at the low-side transistor ($Q_{LS}$) 108). When the voltage at node M ($V_M$) reaches the voltage value of the regulated voltage ($V_{CC}$), the second transistor ($Q_2$) 204 is deactivated (i.e., in the OFF state). Accordingly, there is no conduction path from pad 218 (i.e., voltage at the low-side transistor ($Q_{LS}$) 108) to the regulated voltage ($V_{CC}$), which addresses the drawback of the low-side drive circuitry 400.

Figure 6:
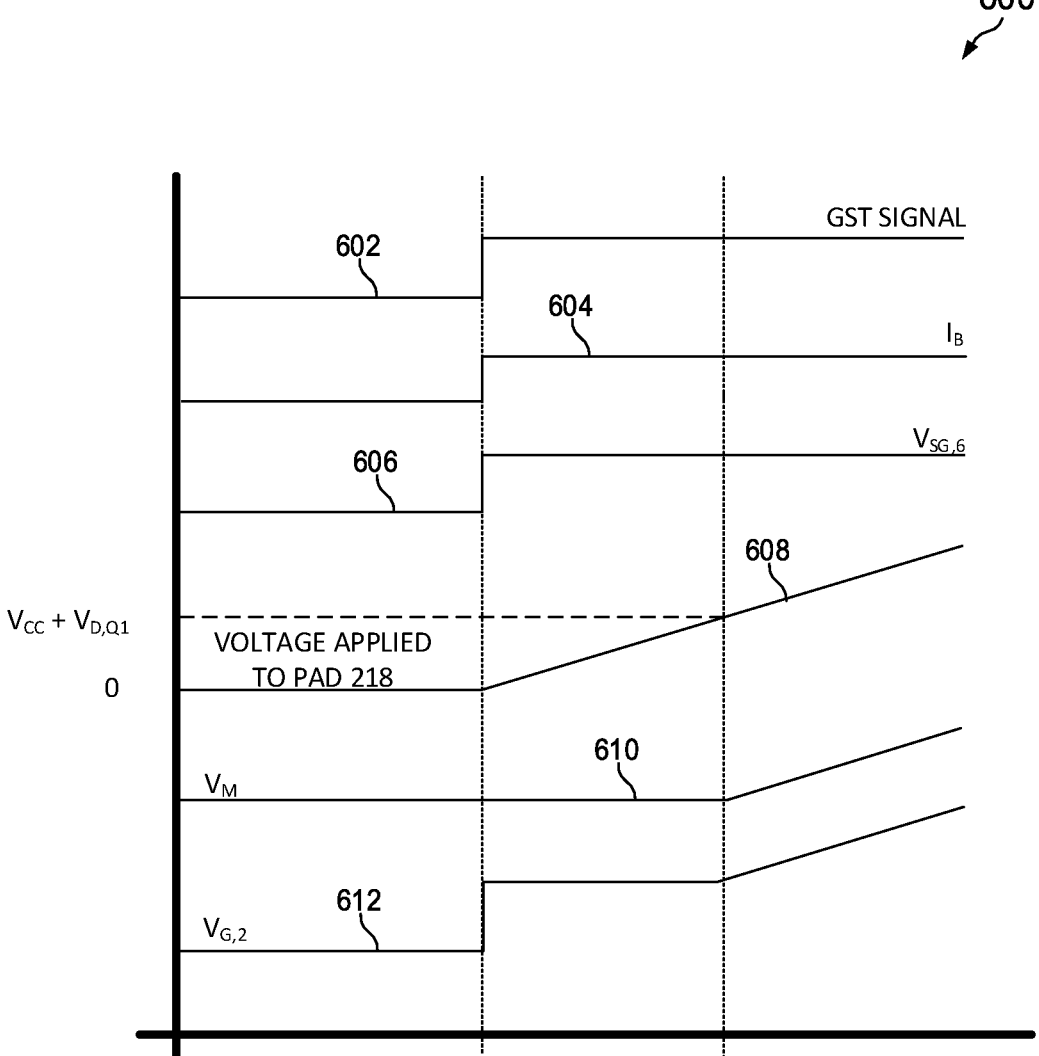
FIG. 6 are a set of plots of an embodiment operation of the low-side drive circuitry of FIG. 5 during gate stress mode.

FIG. 6 illustrates a set of plots 600 of an embodiment operation of the low-side drive circuitry 500 during gate stress mode. During gate stress, the gate voltage of the first transistor ($Q_1$) 202 is set to the voltage value of the regulated voltage ($V_{CC}$) through the first driving stage circuit 214 (i.e., the gate-to-source voltage ($V_{GS,1}$) equals zero). Accordingly, as the first transistor ($Q_1$) 202 is an enhancement-mode p-channel MOSFET, the first transistor ($Q_1$) 202 is deactivated. In contrast, the gate voltages of the third transistor ($Q_3$) 206 is set to the ground reference through the second driving stage circuit 216 (i.e., the gate-to-source voltage ($V_{GS,2}$) equals zero). Further, the fourth transistor ($Q_4$) 208 is deactivated through the control signal ($X_{GST}$) from, for example, the control circuitry 112. Accordingly, as the third transistor ($Q_3$) 206 and the fourth transistor ($Q_4$) 208 are enhancement-mode n-channel MOSFETs, the third transistor ($Q_3$) 206 and the fourth transistor ($Q_4$) 208 are deactivated.

At time $T_1$, the gate stress test (GST) signal 602 transitions from zero (i.e., ground reference voltage) to, for example, the regulated ($V_{CC}$) voltage. As the gate stress test (GST) signal 602 controls the operation of the current sink 504, at time $T_1$, the current source sink 504 begins sinking a current ($I_B$) 604 at a common node at the drain terminal of the sixth transistor ($Q_6$) 502 and the gate terminals of the fifth transistor ($Q_5$) 402 and the sixth transistor ($Q_6$) 502.

Before time $T_1$, the drain and gate terminals of the sixth transistor ($Q_6$) 502 are coupled to the reference ground as the current sink 504 is not sinking any current. The gate to source voltage ($V_{GS,6}$) 606 is at the regulated voltage ($V_{CC}$) since the source terminal is coupled to the regulated voltage ($V_{CC}$), and the gate terminal is at the reference ground. The negative (i.e., negative with respect to the gate terminal) source-to-gate voltage ($V_{GS,6}$) 606 keeps the sixth transistor ($Q_6$) 502 in an OFF state-sixth transistor ($Q_6$) 502 is an enhancement-mode p-channel MOSFET.

When the current sink 504 begins to sink the current ($I_B$) 604 at time $T_1$, the current sink 504 generates a voltage across itself. The more current it draws, the higher the voltage drop across the current sink 504. Since the drain terminal of the sixth transistor ($Q_6$) 502 is coupled to reference ground through the current sink 504, the voltage at the drain (and hence at the gate since they are coupled) will rise from ground potential towards the regulated voltage ($V_{CC}$) as long as current ($I_B$) 604 is flowing through the current sink 504.

At time $T_1$, the gate stress test (GST) is asserted, resulting in the current ($I_B$) 604 being sunk through the current sink 504. The voltage at the gate terminal ($V_{G,6}$) of the sixth transistor ($Q_6$) 502 decreases due to the current ($I_B$) 604 being sunk through the current sink 504. When the source-to-gate voltage ($V_{SG,6}$) 606 of the sixth transistor ($Q_6$) 502 is sufficiently positive relative to the threshold voltage ($V_{TH,6}$) of the sixth transistor ($Q_6$) 502, this turns on the sixth transistor ($Q_6$) 502.

Concurrently, the voltage at the gate terminal of the fifth transistor ($Q_5$) 402, coupled to the gate terminal of the sixth transistor ($Q_6$) 502, transitions from the regulated voltage ($V_{CC}$) to the regulated voltage ($V_{CC}$) minus the source-to-gate voltage ($V_{SG,6}$) 606 of the sixth transistor ($Q_6$) 502: $V_{G,5}=V_{CC}-V_{SG,6}$.

Before time $T_1$, the second transistor ($Q_2$) 204 is in the ON state (the gate terminal of the second transistor ($Q_2$) 204 is grounded), and the voltage at node M ($V_M$) 610 is at the regulated voltage ($V_{CC}$).

At time $T_1$, the fourth transistor ($Q_4$) 208 is deactivated through the control signal ($X_{GST}$) generated by, for example, the control circuitry 112. The deactivation of the fourth transistor ($Q_4$) 208 causes the gate terminal of the second transistor ($Q_2$) 204 to become floating—the potential of the gate terminal of the second transistor ($Q_2$) 204 is close to ground reference potential. The contact probe (e.g., needles) of the ATE probe card contacts pad 218 and applies an external voltage 608 to the gate terminal of the low-side transistor ($Q_{LS}$) 108.

At time $T_2$, the external voltage 608 exceeds the regulated voltage ($V_{CC}$) plus the threshold voltage of the diode of the first transistor ($Q_1$) 202, resulting in the parasitic diode of the first transistor ($Q_1$) 202 being forward-biased. Accordingly, when the diode of the first transistor ($Q_1$) 202 is forward biased, the voltage at node M ($V_M$) 610 and the voltage at the source terminal of the second transistor ($Q_2$) 204 follow the external voltage 608 minus the threshold voltage of the diode of the first transistor ($Q_1$) 202. Accordingly, before time $T_1$, the voltage at the gate terminal of the second transistor ($Q_2$) 204 ($V_{G,2}$) 612 is at zero, at time $T_1$, it transitions to the regulated voltage ($V_{CC}$), and from time $T_2$ onwards, it tracks the gradual voltage increase of the external voltage 608.

Between time $T_1$ and time $T_2$, as the voltage at node M ($V_M$) 610 remains at the regulated voltage ($V_{CC}$)—the parasitic diode of the first transistor ($Q_1$) 202 is not yet forward-biased, the gate terminal of the second transistor ($Q_2$) 204 is coupled to its source terminal through the fifth transistor ($Q_5$) 402.

At time $T_2$, in response to the voltage at node M ($V_M$) 610 exceeding the regulated supply voltage ($V_{CC}$), the second transistor ($Q_2$) 204 is completely OFF. Accordingly, there is no conduction path from pad 218 to the regulated supply voltage ($V_{CC}$), which resolves the drawback in low-side drive circuitry 400.

Figure 7:
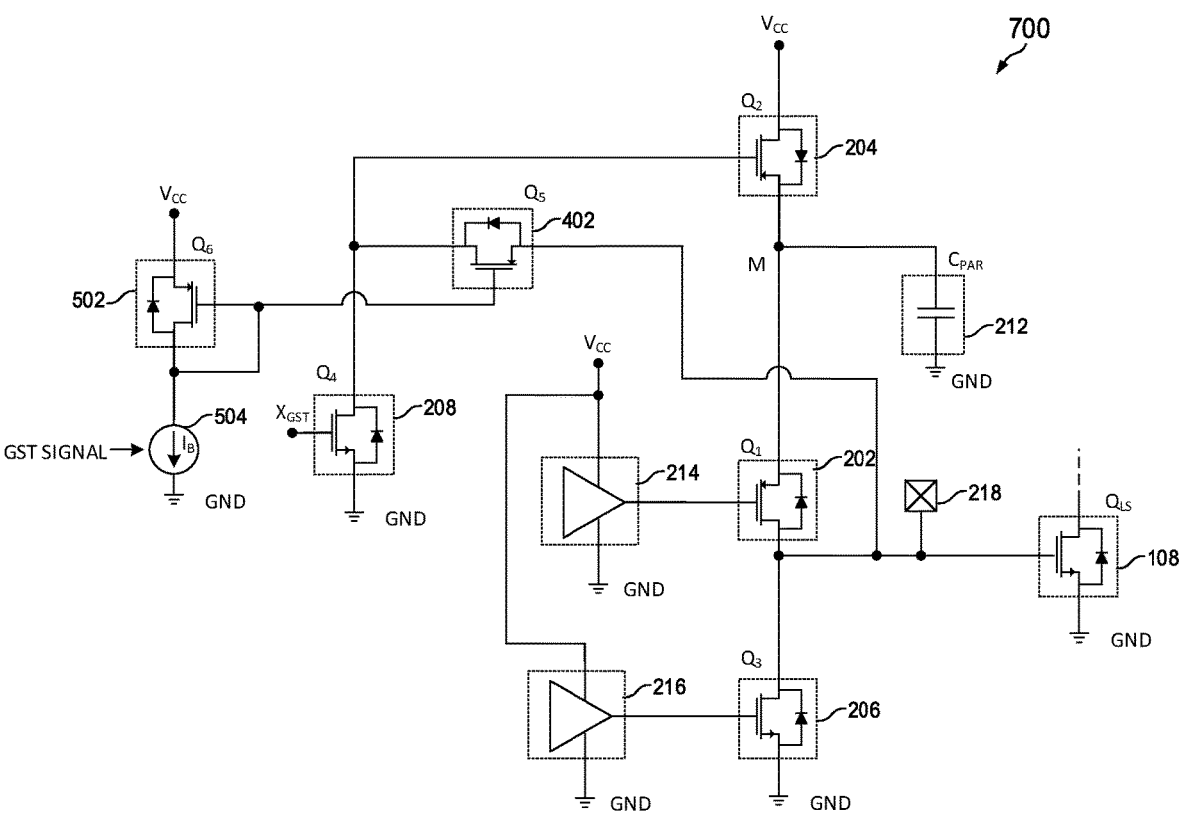
FIG. 7 is a schematic of an embodiment low-side drive circuitry.

FIG. 7 illustrates a schematic of an embodiment low-side drive circuitry 700, which may be implemented, for example, as the low-side drive circuitry 106 in the DC-DC converter 100 and to gate stress the low-side transistor ($Q_{LS}$) 108.

Similar to the low-side drive circuitry 500, the low-side drive circuitry 700 includes the first transistor ($Q_1$) 202, the second transistor ($Q_2$) 204, the third transistor ($Q_3$) 206, the fourth transistor ($Q_4$) 208, the fifth transistor ($Q_5$) 402, the sixth transistor ($Q_6$) 502, the parasitic capacitor ($C_{PAR}$) 212, the first driving stage circuit 214, and the second driving stage circuit 216, which may (or may not) be arranged as shown. In contrast to the low-side drive circuitry 500, where the source terminal of the fifth transistor ($Q_5$) 402 is coupled to node M, in the low-side drive circuitry 700, the source terminal of the fifth transistor ($Q_5$) 402 is coupled to a common node between the drain terminal of the first transistor ($Q_1$) 202, the drain terminal of the third transistor ($Q_3$) 206, the pad 218, and the gate terminal of the second transistor ($Q_{LS}$) 108.

As the components and other arrangements in the low-side drive circuitry 700 are identical to the low-side drive circuitry 400, the circuit description is not repeated. Low-side drive circuitry 700 may include additional components not shown.

Figure 8:
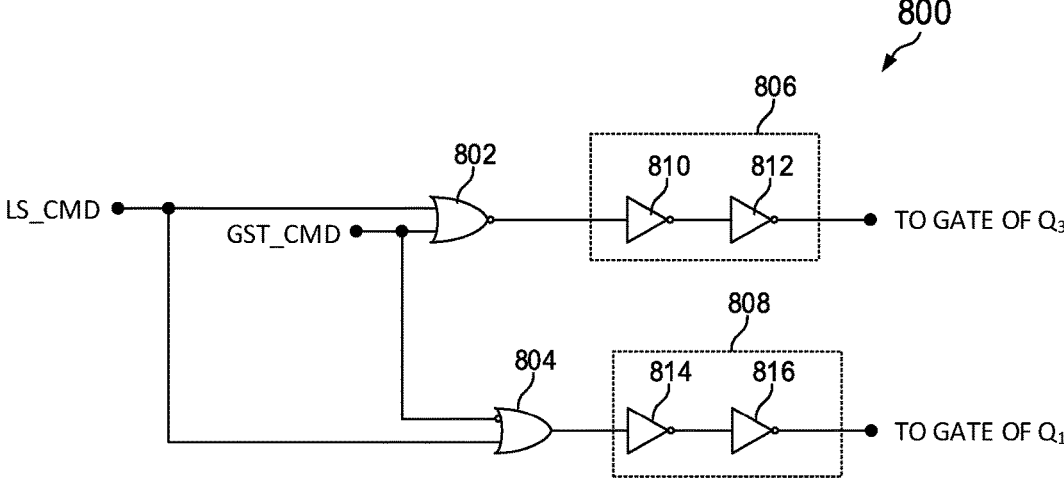
FIG. 8 is a schematic of an embodiment driving circuit.

FIG. 8 illustrates a schematic of an embodiment driving circuit 800, which may be implemented as the first driving stage circuit 214 and the second driving stage circuit 216. Driving circuit 800 includes a NOR gate 802, an OR gate 804 with one inverted input, a first buffer gate 806, and a second buffer gate 808, which may (or may not) be arranged as shown.

A first input of the NOR gate 802 and the non-inverting input of the OR gate 804 are coupled to a low-side command (LS_CMD) signal generated by, for example, the control circuitry 112. A second input of the NOR gate 802 and the inverting input of the OR gate 804 are coupled to a gate stress test command (GST_CMD) signal generated by, for example, the control circuitry 120.

The low-side command (LS_CMD) signal is provided during the functional operation of the low-side drive circuitry. The gate stress test command (GST_CMD) signal is asserted during the gate stress operation of the low-side drive circuitry.

The first buffer gate 806 includes a first inverter 810 coupled to a second inverter 812. The output of the first buffer gate 806 is coupled to the gate terminal of the third transistor ($Q_3$) 206.

The second buffer gate 808 includes a third inverter 814 coupled to a fourth inverter 816. The output of the second buffer gate 808 is coupled to the gate terminal of the first transistor ($Q_1$) 202.

FIG. 9 illustrates a flow chart of a method 900 for operating a low-side drive circuitry used to gate stress a transistor, according to the embodiments disclosed. It is noted that all steps outlined in the flow chart of method 900 are not necessarily required and can be optional. Further, changes to the arrangement of the steps, removal of one or more steps and path connections, and addition of steps and path connections are similarly contemplated.

At step 902, a first control signal is provided to a gate terminal of a first p-channel metal-oxide-semiconductor field effect transistor (MOSFET) to deactivate the first p-channel MOSFET. In embodiments, a drain terminal of the first p-channel MOSFET is coupled to a gate terminal of the transistor.

At step 904, a second control signal is provided to a gate terminal of a first n-channel MOSFET to deactivate the first n-channel MOSFET. In embodiments, a source terminal of the first n-channel MOSFET is coupled to the reference ground. In embodiments, a drain terminal of the first n-channel MOSFET is coupled to the gate terminal of the transistor.

At step 906, a third control signal (i.e., $X_{GST}$) is provided to a gate terminal of a second n-channel MOSFET to deactivate the second n-channel MOSFET, causing the gate terminal of the second transistor ($Q_2$) 204 to be floating. In embodiments, a source terminal of the second n-channel MOSFET is coupled to the reference ground. In embodiments, a drain terminal of the second n-channel MOSFET is coupled to a gate terminal of a second p-channel MOSFET. In embodiments, a source terminal of the second p-channel MOSFET is coupled to a source terminal of the first p-channel MOSFET at a common node. In embodiments, a drain terminal of the second p-channel MOSFET is coupled to a supply voltage rail.

At step 908, a fourth control signal is provided to a current source to generate a current flow at a drain terminal of a fourth p-channel MOSFET to the reference ground. In embodiments, the fourth p-channel MOSFET is arranged in a trans-diode configuration. In embodiments, a gate terminal of a third p-channel MOSFET coupled to a gate terminal of the fourth p-channel MOSFET. In embodiments, a source terminal of the fourth p-channel MOSFET is coupled to the supply voltage rail. In embodiments, a source terminal of the third p-channel MOSFET is coupled to the common node. In embodiments, a drain terminal of the third p-channel MOS-FET coupled drain terminal of the second n-channel MOS-FET.

At step 910, an external voltage is applied to the transistor to gate-stress the transistor. In response to the external voltage exceeding a voltage at the supply voltage rail, the second p-channel MOSFET transitions from ON to OFF.

In embodiments, the first, the second, the third, and the fourth p-channel MOSFETs and the first and the second n-channel MOSFETs are enhancement-mode type MOS-FETs.

In embodiments, during a transistor's functional mode, the third p-channel MOSFET, the fourth p-channel MOS-FET, and the second n-channel MOSFET are in the OFF state, and the second p-channel MOSFET is in the ON state.

In embodiments, when the current flow at the drain terminal of the fourth p-channel MOSFET exceeds a threshold, the third p-channel MOSFET and the fourth p-channel MOSFET transition from an OFF state to an ON state.

In embodiments, the transistor is a low-side switch of a DC-DC power converter. In embodiments, the control circuitry of the DC-DC power converter generates the first, second, third, and fourth control signals.

A first aspect relates to a circuit for gate stress testing a transistor. The circuit includes a first p-channel metal-oxide-semiconductor field effect transistor (MOSFET), a drain terminal of the first p-channel MOSFET coupled to a gate terminal of the transistor; a second p-channel MOSFET, a source terminal and a drain terminal of the second p-channel MOSFET coupled to a source terminal of the first p-channel MOSFET at a first node and a supply voltage rail, respectively; a first n-channel MOSFET, a source terminal and a drain terminal of the first n-channel MOSFET coupled to a reference ground and the gate terminal of the transistor, respectively; a second n-channel MOSFET, a source terminal and a drain terminal of the second n-channel MOSFET coupled to the reference ground and a gate terminal of the second p-channel MOSFET, respectively; a third p-channel MOSFET, a source terminal and a drain terminal of the third p-channel MOSFET coupled to the first node and the drain terminal of the second n-channel MOSFET, respectively; a fourth p-channel MOSFET arranged in a trans-diode configuration, a gate terminal of the third p-channel MOSFET coupled to a gate terminal of the fourth p-channel MOSFET, a source terminal of the fourth p-channel MOSFET coupled to the supply voltage rail; and a current source arranged between the drain terminal of the fourth p-channel MOSFET and the reference ground.

In a first implementation form of the circuit according to the first aspect as such, the first, the second, the third, and the fourth p-channel MOSFETs and the first and the second n-channel MOSFETs are enhancement-mode type MOS-FETs.

In a second implementation form of the circuit according to the first aspect as such or any preceding implementation form of the first aspect, the gate terminals of the first p-channel MOSFET, the first n-channel MOSFET, and the second n-channel MOSFET are couplable to a control circuitry to adjust a gate voltage at an associated MOSFET.

In a third implementation form of the circuit according to the first aspect as such or any preceding implementation form of the first aspect, the current source is couplable to a control circuitry to adjust a current sunk through the drain terminal of the fourth p-channel MOSFET to the reference ground.

In a fourth implementation form of the circuit according to the first aspect as such or any preceding implementation form of the first aspect, during gate stress testing, the first p-channel MOSFET, the first n-channel MOSFET, and the second n-channel MOSFET are in an OFF state. During a functional mode of the transistor, the third p-channel MOS-FET, the fourth p-channel MOSFET, and the second n-channel MOSFET are in an OFF state and the second p-channel MOSFET is in an ON state.

In a fifth implementation form of the circuit according to the first aspect as such or any preceding implementation form of the first aspect, during gate stress testing, the second p-channel MOSFET transitions from an ON state to an OFF state in response to an external voltage being applied to the gate of the transistor that exceeds a voltage at the supply voltage rail.

In a sixth implementation form of the circuit according to the first aspect as such or any preceding implementation form of the first aspect, during gate stress testing, the current source is configured to sink a current to generate a source-to-gate voltage to turn ON the third p-channel MOSFET and the fourth p-channel MOSFET.

A second aspect relates to a DC-DC converter that includes a control circuitry, a low-side switch, and a circuit for gate stress testing the low-side switch. The circuit includes a first p-channel metal-oxide-semiconductor field effect transistor (MOSFET), a drain terminal of the first p-channel MOSFET coupled to a gate terminal of the low-side switch; a second p-channel MOSFET, a source terminal and a drain terminal of the second p-channel MOSFET coupled to a source terminal of the first p-channel MOSFET at a first mode node and a supply voltage rail, respectively; a first n-channel MOSFET, a source terminal and a drain terminal of the first n-channel MOSFET coupled to a reference ground and the gate terminal of the low-side switch, respectively; a second n-channel MOSFET, a source terminal and a drain terminal of the second n-channel MOSFET coupled to the reference ground and a gate terminal of the second p-channel MOSFET, respectively; a third p-channel MOSFET, a source terminal and a drain terminal of the third p-channel MOSFET coupled to the first mode node and the drain terminal of the second n-channel MOSFET, respectively; a fourth p-channel MOSFET arranged in a trans-diode configuration, a gate terminal of the third p-channel MOSFET coupled to a gate terminal of the fourth p-channel MOSFET, a source terminal of the fourth p-channel MOSFET coupled to the supply voltage rail; and a current source arranged between the drain terminal of the fourth p-channel MOSFET and the reference ground.

In a first implementation form of the DC-DC converter according to the second aspect as such, the first, the second, the third, and the fourth p-channel MOSFETs and the first and the second n-channel MOSFETs are enhancement-mode type MOSFETs.

In a second implementation form of the DC-DC converter according to the second aspect as such or any preceding implementation form of the second aspect, the gate terminals of the first p-channel MOSFET, the first n-channel MOSFET, and the second n-channel MOSFET are coupled to the control circuitry, the control circuitry configured to adjust a gate voltage at an associated MOSFET.

In a third implementation form of the DC-DC converter according to the second aspect as such or any preceding implementation form of the second aspect, the current source is coupled to the control circuitry, the control circuitry configured to adjust a current sunk through the drain terminal of the fourth p-channel MOSFET to the reference ground.

In a fourth implementation form of the DC-DC converter according to the second aspect as such or any preceding implementation form of the second aspect, during gate stress testing, the first p-channel MOSFET, the first n-channel MOSFET, and the second n-channel MOSFET are in an OFF state. During a functional mode of the transistor, the third p-channel MOSFET, the fourth p-channel MOSFET, and the second n-channel MOSFET are in an OFF state and the second p-channel MOSFET is in an ON state.

In a fifth implementation form of the DC-DC converter according to the second aspect as such or any preceding implementation form of the second aspect, during gate stress testing, the second p-channel MOSFET transitions from an ON state to an OFF state in response to an external voltage being applied to the gate of the transistor that exceeds a voltage at the supply voltage rail.

In a sixth implementation form of the DC-DC converter according to the second aspect as such or any preceding implementation form of the second aspect, during gate stress testing, the current source is configured to sink a current to generate a source-to-gate voltage to turn ON the third p-channel MOSFET and the fourth p-channel MOSFET.

A third aspect relates to a method for gate stress testing a transistor. The method includes applying a first control signal to a gate terminal of a first p-channel metal-oxide-semiconductor field effect transistor (MOSFET) to deactivate the first p-channel MOSFET, a drain terminal of the first p-channel MOSFET coupled to a gate terminal of the transistor; applying a second control signal to a gate terminal of a first n-channel MOSFET to deactivate the first n-channel MOSFET, a source terminal and a drain terminal of the first n-channel MOSFET coupled to a reference ground and the gate terminal of the transistor, respectively; applying a third control signal to a gate terminal of a second n-channel MOSFET to deactivate the second n-channel MOSFET and place the gate terminal of a second p-channel MOSFET as a floating node, a source terminal and a drain terminal of the second n-channel MOSFET coupled to the reference ground and a gate terminal of the second p-channel MOSFET, respectively, and a source terminal and a drain terminal of the second p-channel MOSFET coupled to a source terminal of the first p-channel MOSFET at a first node and a supply voltage rail, respectively; applying a fourth control signal to a current source to generate a current flow at a drain terminal of a fourth p-channel MOSFET to the reference ground, the fourth p-channel MOSFET arranged in a trans-diode configuration, a gate terminal of a third p-channel MOSFET coupled to a gate terminal of the fourth p-channel MOSFET, a source terminal of the fourth p-channel MOSFET coupled to the supply voltage rail, and a source terminal and a drain terminal of the third p-channel MOSFET coupled to the first node and the drain terminal of the second n-channel MOS-FET, respectively; and applying an external voltage to the transistor to gate stress the transistor, wherein in response to the external voltage exceeding a voltage at the supply voltage rail, the second p-channel MOSFET transitions from an ON state to an OFF state.

In a first implementation form of the method according to the third aspect as such, the first, the second, the third, and the fourth p-channel MOSFETs and the first and the second n-channel MOSFETs are enhancement-mode type MOS-FETs.

In a second implementation form of the method according to the third aspect as such or any preceding implementation form of the third aspect, during a functional mode of the transistor, the third p-channel MOSFET, the fourth p-channel MOSFET, and the second n-channel MOSFET are in the OFF state and the second p-channel MOSFET is in the ON state.

In a third implementation form of the method according to the third aspect as such or any preceding implementation form of the third aspect, in response to the current flow at the drain terminal of the fourth p-channel MOSFET exceeding a threshold, the third p-channel MOSFET and the fourth p-channel MOSFET transition from an OFF state to an ON state.

In a fourth implementation form of the method according to the third aspect as such or any preceding implementation form of the third aspect, the transistor is a low-side switch of a DC-DC power converter.

In a fifth implementation form of the method according to the third aspect as such or any preceding implementation form of the third aspect, the method further includes generating the first, second, third, and fourth control signals by a control circuitry of the DC-DC power converter.

A fourth aspect relates to a circuit for gate stress testing a transistor. The circuit comprising a first p-channel metal-oxide-semiconductor field effect transistor (MOSFET), a drain terminal of the first p-channel MOSFET coupled to a gate terminal of the transistor; a second p-channel MOSFET, a source terminal and a drain terminal of the second p-channel MOSFET coupled to a source terminal of the first p-channel MOSFET at a first node and a supply voltage rail, respectively; a first n-channel MOSFET, a source terminal and a drain terminal of the first n-channel MOSFET coupled to a reference ground and the gate terminal of the transistor, respectively; a second n-channel MOSFET, a source terminal and a drain terminal of the second n-channel MOSFET coupled to the reference ground and a gate terminal of the second p-channel MOSFET, respectively; a resistor having a first terminal coupled to the a source terminal of the first p-channel MOSFET, a second terminal of the resistor coupled to the drain terminal of the second n-channel MOSFET.

In a first implementation form of the circuit according to the fourth aspect as such, the first and the second p-channel MOSFETs and the first and the second n-channel MOSFETs are enhancement-mode type MOSFETs.

In a second implementation form of the circuit according to the fourth aspect as such or any preceding implementation form of the fourth aspect, the gate terminals of the first p-channel MOSFET, the first n-channel MOSFET, and the second n-channel MOSFET are couplable to a control circuitry to adjust a gate voltage at an associated MOSFET.

In a third implementation form of the circuit according to the fourth aspect as such or any preceding implementation form of the fourth aspect, during gate stress testing, the first p-channel MOSFET, the first n-channel MOSFET, and the second n-channel MOSFET are in an OFF state. During a functional mode of the transistor the second n-channel MOSFET is in an OFF state and the second p-channel MOSFET is in an ON state.

In a fourth implementation form of the circuit according to the fourth aspect as such or any preceding implementation form of the fourth aspect, during gate stress testing, the second p-channel MOSFET transitions from an ON state to an OFF state in response to an external voltage being applied to the gate of the transistor that exceeds a voltage at the supply voltage rail.

A fifth aspect relates to a circuit for gate stress testing a transistor. The circuit comprising a first p-channel metal-oxide-semiconductor field effect transistor (MOSFET), a drain terminal of the first p-channel MOSFET coupled to a gate terminal of the transistor; a second p-channel MOSFET, a source terminal and a drain terminal of the second p-channel MOSFET coupled to a source terminal of the first p-channel MOSFET at a first node and a supply voltage rail, respectively; a first n-channel MOSFET, a source terminal and a drain terminal of the first n-channel MOSFET coupled to a reference ground and the gate terminal of the transistor, respectively; a second n-channel MOSFET, a source terminal and a drain terminal of the second n-channel MOSFET coupled to the reference ground and a gate terminal of the second p-channel MOSFET, respectively; a third p-channel MOSFET, a source terminal and a drain terminal of the third p-channel MOSFET coupled to the first node and the drain terminal of the second n-channel MOSFET, respectively.

In a first implementation form of the circuit according to the fifth aspect as such, the first, the second, and the third p-channel MOSFETs and the first and the second n-channel MOSFETs are enhancement-mode type MOSFETs.

In a second implementation form of the circuit according to the fifth aspect as such or any preceding implementation form of the fifth aspect, the gate terminals of the first p-channel MOSFET, the first n-channel MOSFET, and the second n-channel MOSFET are couplable to a control circuitry to adjust a gate voltage at an associated MOSFET, the gate terminal of the third p-channel MOSFET is coupled to the supply voltage rail.

In a third implementation form of the circuit according to the fifth aspect as such or any preceding implementation form of the fifth aspect, during gate stress testing, the first p-channel MOSFET, the first n-channel MOSFET, and the second n-channel MOSFET are in an OFF state. During a functional mode of the transistor the second n-channel MOSFET is in an OFF state and the second p-channel MOSFET is in an ON state.

In a fourth implementation form of the circuit according to the fifth aspect as such or any preceding implementation form of the fifth aspect, during gate stress testing, the second p-channel MOSFET transitions from an ON state to an OFF state in response to an external voltage being applied to the gate of the transistor that exceeds a voltage at the supply voltage rail.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A circuit for gate stress testing a transistor, the circuit comprising:

a first p-channel metal-oxide-semiconductor field effect transistor (MOSFET), a drain terminal of the first p-channel MOSFET coupled to a gate terminal of the transistor;

a second p-channel MOSFET, a source terminal and a drain terminal of the second p-channel MOSFET coupled to a source terminal of the first p-channel MOSFET at a first node and a supply voltage rail, respectively;

a first n-channel MOSFET, a source terminal and a drain terminal of the first n-channel MOSFET coupled to a reference ground and the gate terminal of the transistor, respectively;

a second n-channel MOSFET, a source terminal and a drain terminal of the second n-channel MOSFET coupled to the reference ground and a gate terminal of the second p-channel MOSFET, respectively;

a third p-channel MOSFET, a source terminal and a drain terminal of the third p-channel MOSFET coupled to the first node and the drain terminal of the second n-channel MOSFET, respectively;

a fourth p-channel MOSFET arranged in a trans-diode configuration, a gate terminal of the third p-channel MOSFET coupled to a gate terminal of the fourth p-channel MOSFET, a source terminal of the fourth p-channel MOSFET coupled to the supply voltage rail; and a current source arranged between a drain terminal of the fourth p-channel MOSFET and the reference ground.

2. The circuit of claim 1, wherein the first, the second, the third, and the fourth p-channel MOSFETs and the first and the second n-channel MOSFETs are enhancement-mode type MOSFETs.

3. The circuit of claim 1, wherein gate terminals of the first p-channel MOSFET, the first n-channel MOSFET, and the second n-channel MOSFET are couplable to a control circuitry to adjust a gate voltage at an associated MOSFET.

4. The circuit of claim 1, wherein the current source is couplable to a control circuitry to adjust a current sunk through the drain terminal of the fourth p-channel MOSFET to the reference ground.

5. The circuit of claim 1, wherein during gate stress testing, the first p-channel MOSFET, the first n-channel MOSFET, and the second n-channel MOSFET are in an OFF state, and wherein during a functional mode of the transistor, the third p-channel MOSFET, the fourth p-channel MOSFET, and the second n-channel MOSFET are in an OFF state and the second p-channel MOSFET is in an ON state.

6. The circuit of claim 1, wherein during gate stress testing, the second p-channel MOSFET transitions from an ON state to an OFF state in response to an external voltage being applied to the gate terminal of the transistor that exceeds a voltage at the supply voltage rail.

7. The circuit of claim 1, wherein during gate stress testing, the current source is configured to sink a current to generate a source-to-gate voltage to turn ON the third p-channel MOSFET and the fourth p-channel MOSFET.

8. A DC-DC converter, comprising:

a control circuitry;

a low-side switch; and a circuit for gate stress testing the low-side switch, the circuit comprising:

a first p-channel metal-oxide-semiconductor field effect transistor (MOSFET), a drain terminal of the first p-channel MOSFET coupled to a gate terminal of the low-side switch;

a second p-channel MOSFET, a source terminal and a drain terminal of the second p-channel MOSFET coupled to a source terminal of the first p-channel MOSFET at a first mode node and a supply voltage rail, respectively;

a first n-channel MOSFET, a source terminal and a drain terminal of the first n-channel MOSFET coupled to a reference ground and the gate terminal of the low-side switch, respectively;

a second n-channel MOSFET, a source terminal and a drain terminal of the second n-channel MOSFET coupled to the reference ground and a gate terminal of the second p-channel MOSFET, respectively;

a third p-channel MOSFET, a source terminal and a drain terminal of the third p-channel MOSFET coupled to the first mode node and the drain terminal of the second n-channel MOSFET, respectively;

a fourth p-channel MOSFET arranged in a trans-diode configuration, a gate terminal of the third p-channel MOSFET coupled to a gate terminal of the fourth p-channel MOSFET, a source terminal of the fourth p-channel MOSFET coupled to the supply voltage rail; and a current source arranged between a drain terminal of the fourth p-channel MOSFET and the reference ground.

9. The DC-DC converter of claim 8, wherein the first, the second, the third, and the fourth p-channel MOSFETs and the first and the second n-channel MOSFETs are enhancement-mode type MOSFETs.

10. The DC-DC converter of claim 8, wherein gate terminals of the first p-channel MOSFET, the first n-channel MOSFET, and the second n-channel MOSFET are coupled to the control circuitry, the control circuitry configured to adjust a gate voltage at an associated MOSFET.

11. The DC-DC converter of claim 8, wherein the current source is coupled to the control circuitry, the control circuitry configured to adjust a current sunk through the drain terminal of the fourth p-channel MOSFET to the reference ground.

12. The DC-DC converter of claim 8, wherein during gate stress testing, the first p-channel MOSFET, the first n-channel MOSFET, and the second n-channel MOSFET are in an OFF state, and wherein during a functional mode of the transistor, the third p-channel MOSFET, the fourth p-channel MOSFET, and the second n-channel MOSFET are in an OFF state and the second p-channel MOSFET is in an ON state.

13. The DC-DC converter of claim 8, wherein during gate stress testing, the second p-channel MOSFET transitions from an ON state to an OFF state in response to an external voltage being applied to the gate terminal of the transistor that exceeds a voltage at the supply voltage rail.

14. The DC-DC converter of claim 8, wherein during gate stress testing, the current source is configured to sink a current to generate a source-to-gate voltage to turn ON the third p-channel MOSFET and the fourth p-channel MOSFET.

15. A method for gate stress testing a transistor, the method comprising:

applying a first control signal to a gate terminal of a first p-channel metal-oxide-semiconductor field effect transistor (MOSFET) to deactivate the first p-channel MOSFET, a drain terminal of the first p-channel MOSFET coupled to a gate terminal of the transistor;

applying a second control signal to a gate terminal of a first n-channel MOSFET to deactivate the first n-channel MOSFET, a source terminal and a drain terminal of the first n-channel MOSFET coupled to a reference ground and the gate terminal of the transistor, respectively;

applying a third control signal to a gate terminal of a second n-channel MOSFET to deactivate the second n-channel MOSFET and place the gate terminal of a second p-channel MOSFET as a floating node, a source terminal and a drain terminal of the second n-channel MOSFET coupled to the reference ground and a gate terminal of the second p-channel MOSFET, respectively, and a source terminal and a drain terminal of the second p-channel MOSFET coupled to a source terminal of the first p-channel MOSFET at a first node and a supply voltage rail, respectively;

applying a fourth control signal to a current source to generate a current flow at a drain terminal of a fourth p-channel MOSFET to the reference ground, the fourth p-channel MOSFET arranged in a trans-diode configuration, a gate terminal of a third p-channel MOSFET coupled to a gate terminal of the fourth p-channel MOSFET, a source terminal of the fourth p-channel MOSFET coupled to the supply voltage rail, and a source terminal and a drain terminal of the third p-channel MOSFET coupled to the first node and the drain terminal of the second n-channel MOSFET, respectively; and applying an external voltage to the transistor to gate stress the transistor, wherein in response to the external voltage exceeding a voltage at the supply voltage rail, the second p-channel MOSFET transitions from an ON state to an OFF state.

16. The method of claim 15, wherein the first, the second, the third, and the fourth p-channel MOSFETs and the first and the second n-channel MOSFETs are enhancement-mode type MOSFETs.

17. The method of claim 15, wherein during a functional mode of the transistor, the third p-channel MOSFET, the fourth p-channel MOSFET, and the second n-channel MOSFET are in an OFF state and the second p-channel MOSFET is in an ON state.

18. The method of claim 15, wherein in response to the current flow at the drain terminal of the fourth p-channel MOSFET exceeding a threshold, the third p-channel MOSFET and the fourth p-channel MOSFET transition from an OFF state to an ON state.

19. The method of claim 15, wherein the transistor is a low-side switch of a DC-DC power converter.

20. The method of claim 19, further comprising generating the first, second, third, and fourth control signals by a control circuitry of the DC-DC power converter.

* * * * *